United States Patent
Sete et al.

(10) Patent No.: US 9,979,400 B1
(45) Date of Patent: May 22, 2018

(54) ANALYZING CONTROL SIGNALS FOR QUANTUM LOGIC OPERATIONS IN SUPERCONDUCTING QUANTUM CIRCUITS

(71) Applicant: RIGETTI & CO., INC., Berkeley, CA (US)

(72) Inventors: Eyob A. Sete, Walnut Creek, CA (US); William J. Zeng, Emeryville, CA (US); Matthew J. Reagor, Corte Madera, CA (US); Shane Caldwell, Oakland, CA (US)

(73) Assignee: Rigetti & Co., Inc., Berkeley, CA (US)

(*) Notice: Subject to any disclaimer, the term of this patent is extended or adjusted under 35 U.S.C. 154(b) by 0 days. days.

(21) Appl. No.: 15/335,846

(22) Filed: Oct. 27, 2016

(51) Int. Cl.
*H03K 19/195* (2006.01)
*G06N 99/00* (2010.01)

(52) U.S. Cl.
CPC ......... *H03K 19/195* (2013.01); *G06N 99/002* (2013.01)

(58) Field of Classification Search
None
See application file for complete search history.

(56) References Cited

U.S. PATENT DOCUMENTS

| | | | |
|---|---|---|---|
| 9,208,446 B2* | 12/2015 | Pesetski | ................. B82Y 10/00 |
| 2009/0082209 A1 | 3/2009 | Bunyk et al. | |
| 2009/0322374 A1 | 12/2009 | Przybysz et al. | |
| 2013/0278283 A1 | 10/2013 | Berkley | |
| 2015/0358022 A1* | 12/2015 | McDermott, III | ........................ H03K 19/1958 326/5 |
| 2016/0267032 A1 | 9/2016 | Rigetti et al. | |
| 2016/0321559 A1* | 11/2016 | Rose | ..................... G06N 99/005 |
| 2017/0214410 A1* | 7/2017 | Hincks | .................... G05B 17/02 |

FOREIGN PATENT DOCUMENTS

| | | |
|---|---|---|
| WO | 2007/085074 | 8/2007 |
| WO | 2015178990 A2 | 11/2015 |

OTHER PUBLICATIONS

Baugh, et al., "Quantum information processing using nuclear and electron magnetic resonance: review and prospects", arXiv:0710.1447v1 [quant-ph], Oct. 7, 2007, 26 pages.

(Continued)

*Primary Examiner* — Jany Richardson
(74) *Attorney, Agent, or Firm* — Henry Patent Law Firm PLLC

(57) ABSTRACT

In a general aspect, control of a quantum superconducting circuit is analyzed. In some implementation, a parameter set for a control signal for a superconducting quantum circuit is received. The parameters set can include initial voltage amplitudes for respective time segments of the control signal. A first subset of time segments is selected for improving a quality measure of a quantum logic operation produced by delivery of the control signal in the superconducting quantum circuit. New voltage amplitudes are calculated for one or more segments in the first subset, such that the new voltage amplitudes improve the quality measure. The parameter set is updated to include the new voltage amplitudes for the first subset while preserving the initial voltage amplitudes for a second subset of the time segments.

22 Claims, 8 Drawing Sheets

(56) References Cited

OTHER PUBLICATIONS

Choi, et al., "Optimal Quantum Control of Multimode Couplings between Trapped Ion Qubits for Scalable Entanglement", Physical Review Letters 112, 190502, May 16, 2014, 5 pages.
Kelly, et al., "Optimal Quantum Control Using Randomized Benchmarking", Physical Review Letters 112, 240504, Jun. 20, 2014, 5 pages.
Khaneja, et al., "Optimal Control of Coupled Spin Dynamics: Design of NMR Pulse Sequences by Gradient Ascent Algorithms", J. Magn. Reson. 172, 2005, pp. 296-305.
Magesan, et al., "Efficient measurement of quantum gate error by interleaved randomized benchmarking", arXiv:1203.4550v2 [quant-ph], Mar. 19, 2014, 7 pages.
Motzoi, et al., "Simple pulses for elimination of leakage in weakly nonlinear qubits", arXiv:0901.0534v3 [cond-mat.mes-hall], Oct. 22, 2009, 4 pages.
Seeley, et al., "The Bravyi-Kitaev transformation for quantum computation of electronic structure", arXiv:1208.5986v1 [quant-ph], Aug. 30, 2012, 39 pages.
Smith, et al., "A Practical Quantum Instruction Set Architecture", arXiv:1608.03355v1 [quant-ph], Aug. 11, 2016, 14 pages.
Sporl, et al., "Optimal Control of Coupled Josephson Qubits", arXiv:quant-ph/0504202v2, Apr. 27, 2005, 8 pages.
Tsai, et al., "Optimal control of the silicon-based donor electron spin quantum computing", arXiv:0906.0729v1 [cond-mat.mes-hall], Jun. 3, 209, 5 pages.
KIPO, Int'l Search Report and Written Opinion dated Mar. 28, 2018. in PCT/US2017/058811, 13 pgs.

\* cited by examiner

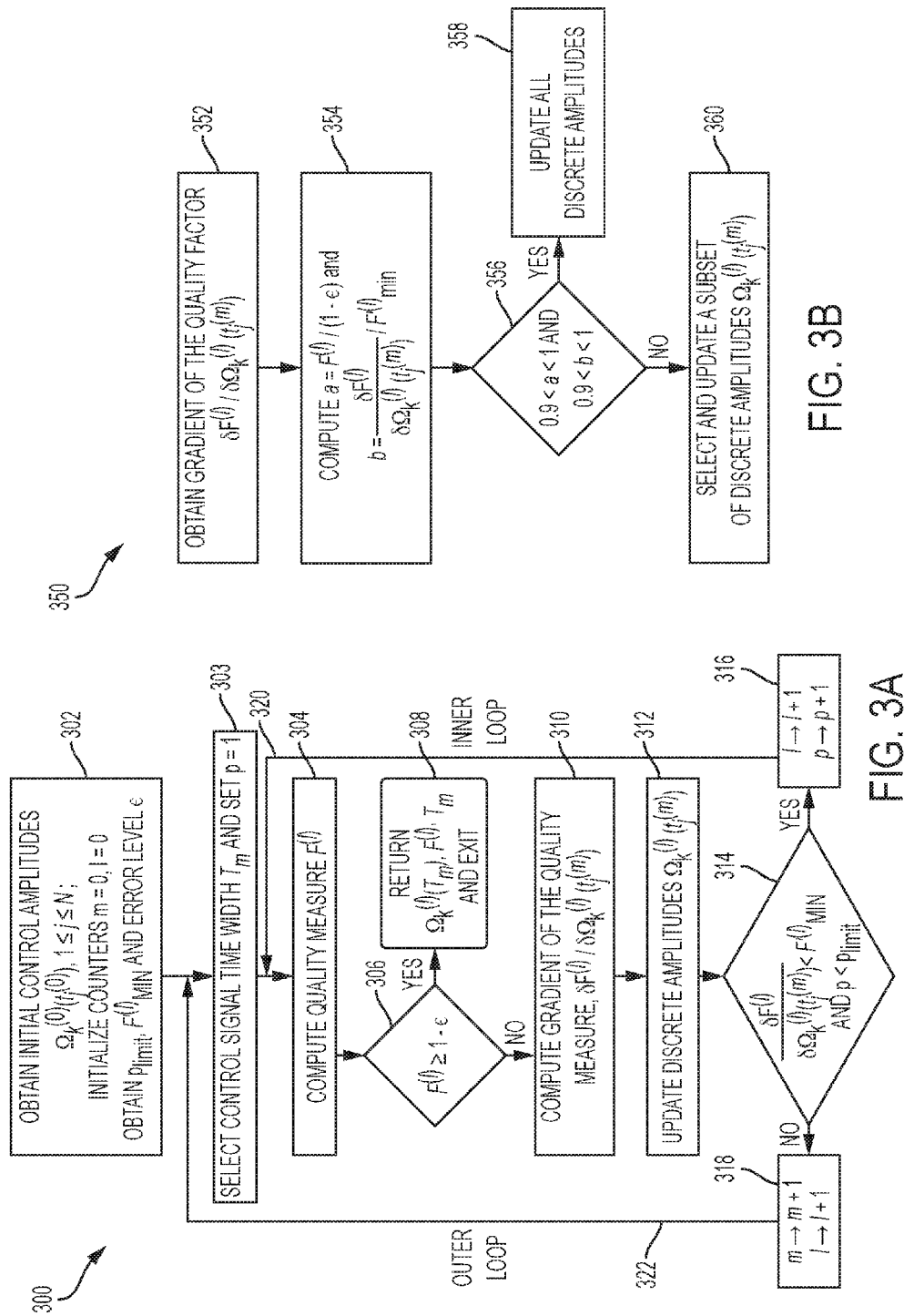

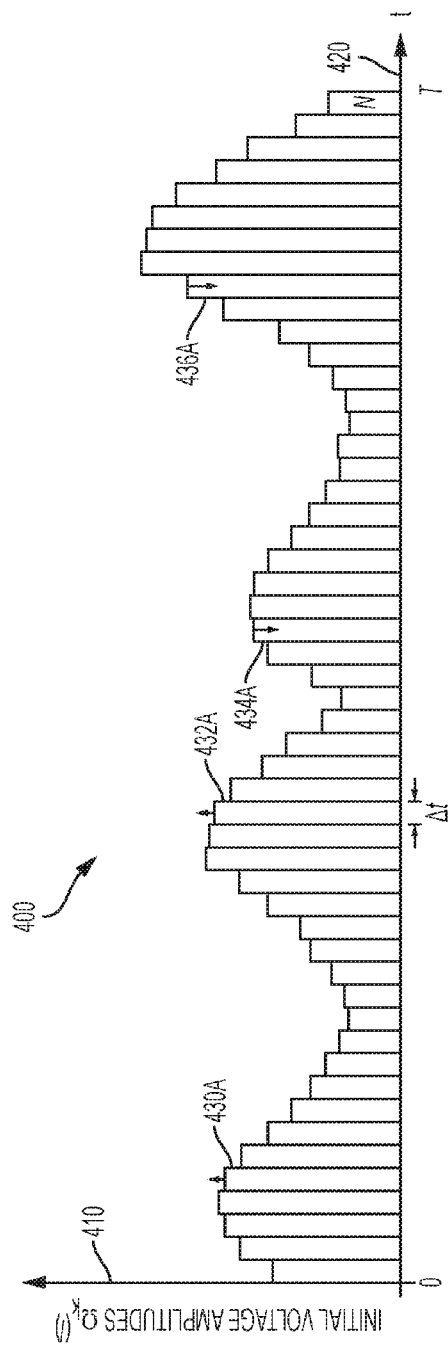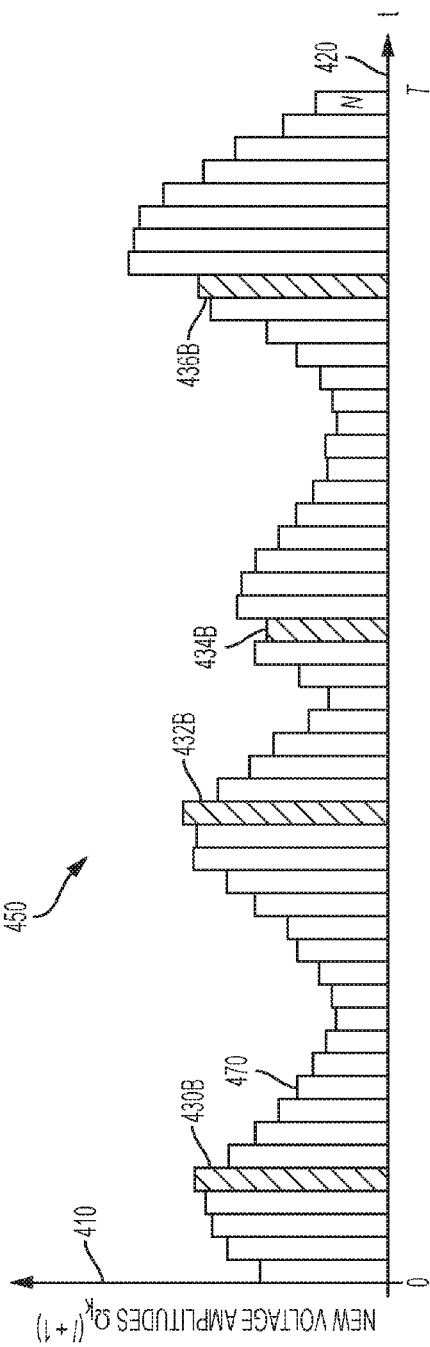

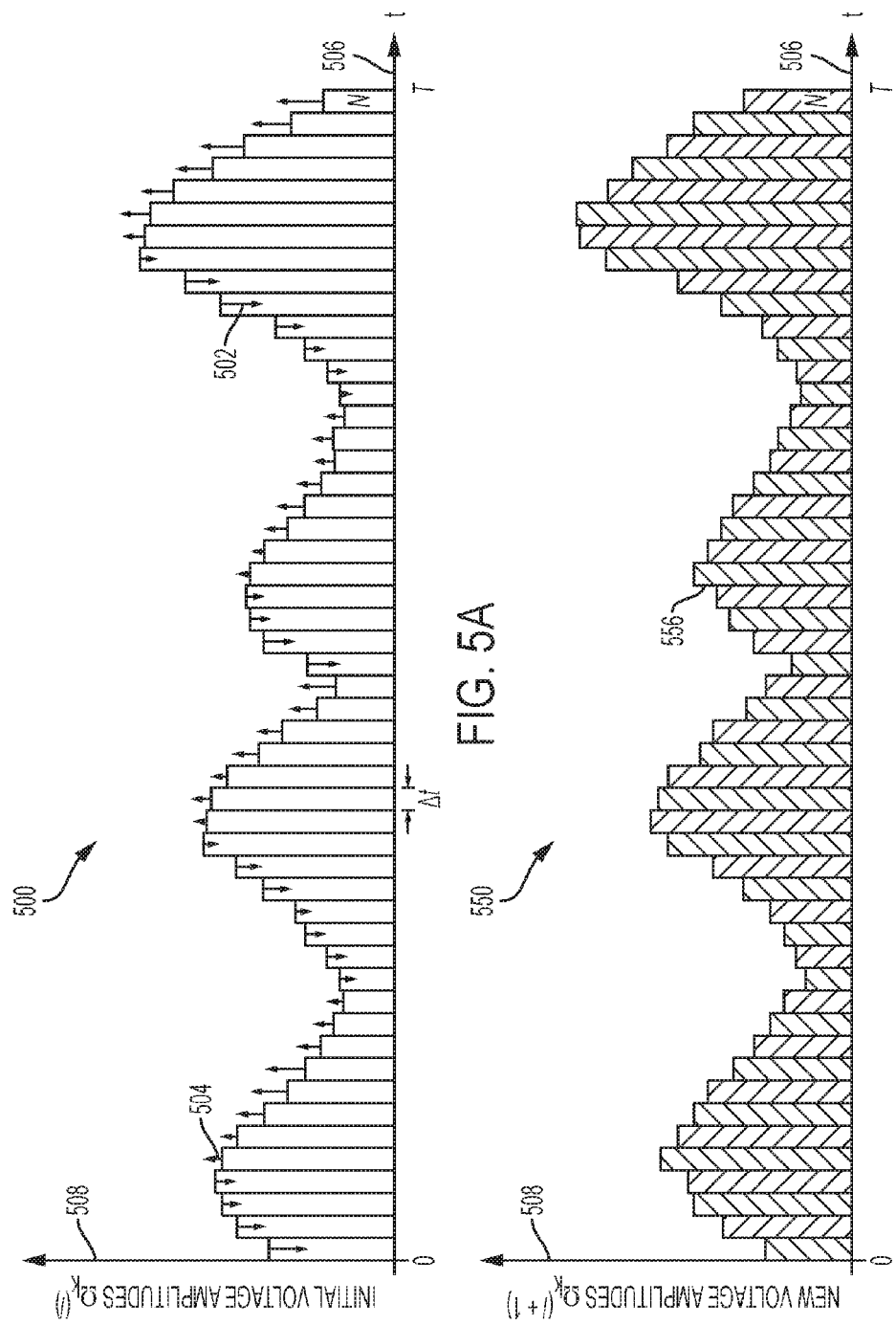

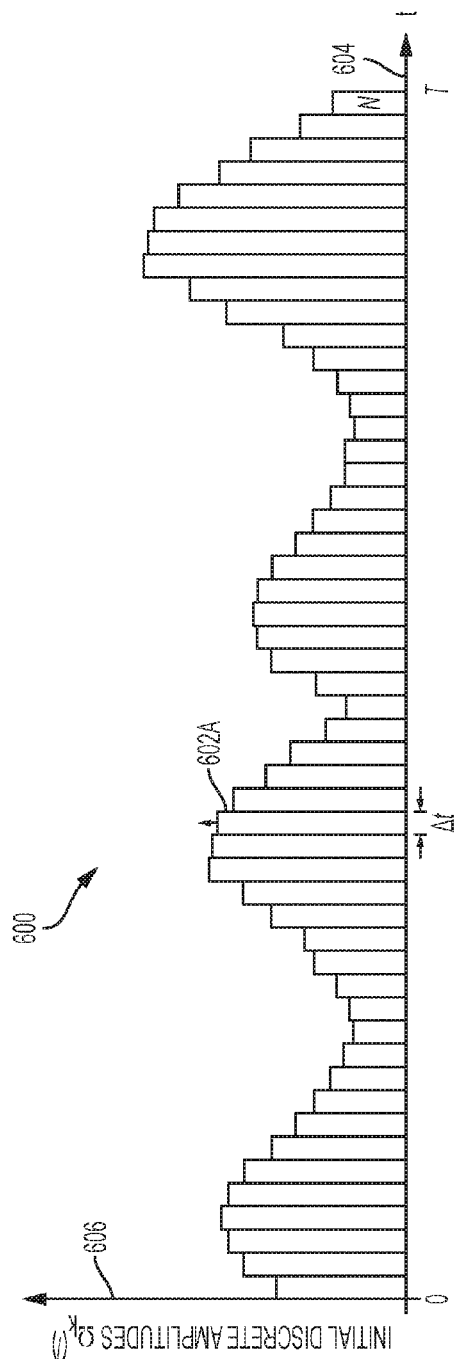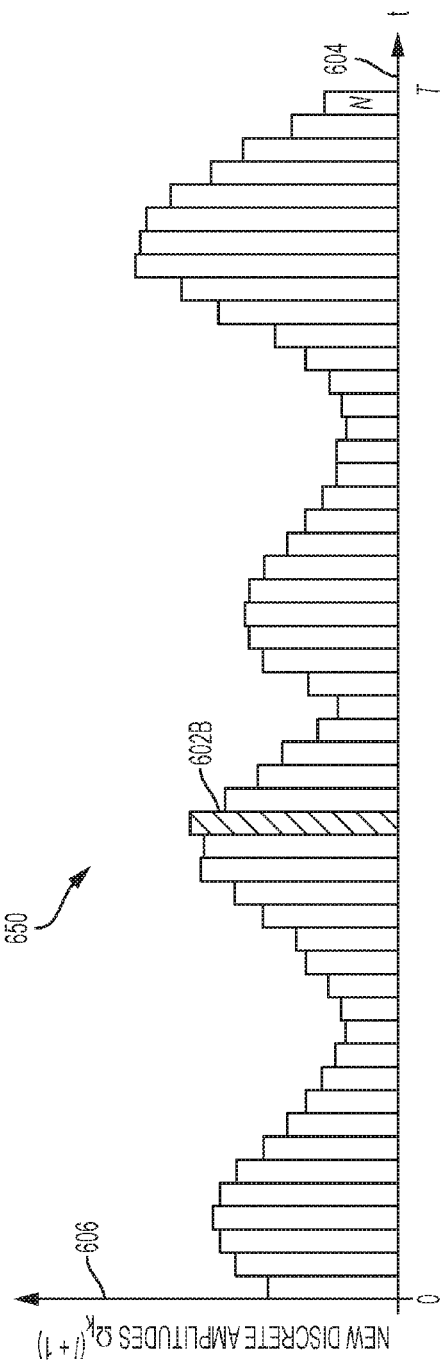

US 9,979,400 B1

ANALYZING CONTROL SIGNALS FOR QUANTUM LOGIC OPERATIONS IN SUPERCONDUCTING QUANTUM CIRCUITS

BACKGROUND

The following description relates to analyzing control signals for quantum logic operations in superconducting quantum circuits.

Quantum computers can perform computational tasks by executing quantum algorithms. A quantum algorithm may often be expressed in terms of quantum logic gates that operate on qubits. In some quantum computing architectures, qubits are implemented in a superconducting quantum circuit, and control signals are delivered to the superconducting quantum circuit to execute the quantum logic gates.

DESCRIPTION OF DRAWINGS

FIG. 3A is a flow diagram for an example process for analyzing a control signal.

FIG. 3B is a flow diagram for an example process for updating a control signal.

FIG. 4A is a plot of an example control signal before an update.

FIG. 4B is a plot of the example control signal from FIG. 4A after an update.

FIG. 5A is a plot of another example control signal before an update.

FIG. 5B is a plot of the example control signal from FIG. 5A after an update.

FIG. 6A is a plot of another example control signal before an update.

FIG. 6B is a plot of the example control signal from FIG. 6A after an update.

DETAILED DESCRIPTION

In some aspects of what is described here, control of a quantum circuit is optimized or otherwise improved by an automated process. A quality measure (e.g., fidelity) of a quantum logic gate can be optimized or otherwise improved, for instance, by tuning the parameters of a control signal that executes the quantum logic gate. In some cases, quantum logic gates form a subset of universal quantum logic gates and provide an important building block of gate-based quantum computing systems. The quality of the quantum logic gates may therefore contribute to the overall performance of the quantum computing system. In some cases, quantum logic gates are executed by delivering control signals to quantum processor circuitry, and the quantum logic gates can be improved by tuning the amplitude, duration or other aspects of the control signals.

In some implementations, one or more parameters of a control signal for a quantum circuit are accessed. For example, a parameter set may include a series of voltage amplitudes for respective time segments of the control signal. A subset of the time segments can be selected and updated in a manner that improves a quality measure of a quantum logic operation (e.g., a quantum logic gate) to be executed by the control signal. For example, new voltage amplitudes for one or more time segments in the subset can be calculated to improve the fidelity of a quantum logic gate. The parameter set can be updated to include the new voltage amplitudes for the subset of time segments, while preserving the initial voltage amplitudes for all other time segments. The parameters of the control signal can be updated iteratively, for instance, an optimization process or another type of process.

Figure 1:
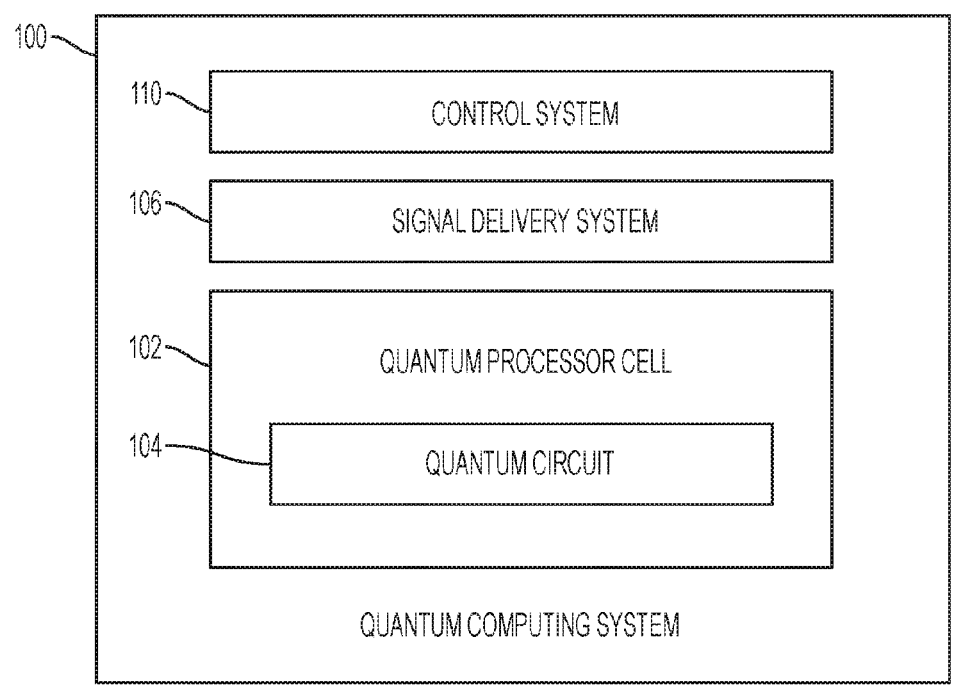
FIG. 1 is a block diagram of an example quantum computing system.

FIG. 1 is a schematic diagram of an example quantum computing system 100. The example quantum computing system 100 shown in FIG. 1 includes a control system 110, a signal delivery system 106, and a quantum processor cell 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. In some instances, quantum logic can be performed in a manner that allows large-scale entanglement within the quantum computing system. Control signals can manipulate the quantum states of individual qubits and the joint states of the multiple qubits. In some instances, information can be read out from the composite quantum system by measuring the quantum states of the individual qubits.

In some implementation the quantum computing system 100 can operate using gate-based models for quantum computing. In some models, fault-tolerance can be achieved by applying a set of high-fidelity control and measurement operations to the qubits. For example, topological quantum error correction schemes can operate on a lattice of nearest-neighbor coupled qubits. In some instances, these and other types of quantum error correcting schemes can be adapted for a two- or three-dimensional lattice of nearest neighbor coupled qubits, for example, to achieve fault-tolerant quantum computation. Adjacent pairs of qubits in the lattice can be addressed, for example, with two-qubit logic operations that are capable of generating entanglement, independent of other pairs in the lattice.

In some implementations, the quantum computing system 100 is constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc.

In some instances, all or part of the quantum processor cell 102 functions as a quantum processor, a quantum memory, or another type of subsystem. The example quantum processor cell 102 shown in FIG. 1 includes a quantum circuit 104. The quantum circuit 104 includes qubit devices, resonator devices and possibly other devices that are used to store and process quantum information. In some implementations, the quantum circuit 104 is a superconducting quantum circuit, in which various circuit elements are capable of operating in a superconducting state. In some implementations, the quantum circuit 104 is an integrated quantum circuit (e.g., an integrated superconducting quantum circuit).

In the example quantum circuit 104, the qubit devices each store a single qubit of information, and the qubits can collectively represent the computational state of a quantum processor or quantum memory. The quantum circuit 104 in the quantum processor cell 102 may also include readout devices that selectively interact with the qubit devices to detect their quantum states. For example, the readout devices may generate readout signals that indicate the computational state of the quantum processor or quantum memory. The quantum circuit 104 may also include coupler devices that selectively operate on individual qubits or pairs of qubits. For example, the coupler devices may produce entanglement or other multi-qubit states over two or more qubits in a quantum processor cell 102.

In some implementations, the example quantum processor cell 102 can process quantum information by applying control signals to the qubit devices or to the coupler devices housed in the quantum processor cell 102. The control signals can be configured to encode information in the qubit devices, to process the information by performing quantum logic gates or other types of operations, or to extract information from the qubit devices. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum processor cell 102. For example, the signal delivery system 106 can receive control signals from the control system 110 and deliver the control signals to the quantum processor cell 102. In some instances, the signal delivery system 106 performs preprocessing, signal conditioning, or other operations to the control signals before delivering them to the quantum processor cell 102.

In the example quantum computing system 100 shown in FIG. 1, the control system 110 controls operation of the quantum processor cell 102. The control system 110 may include data processors, signal generators, interface components, and other types of systems or subsystems. In some cases, the control system 110 includes one or more classical computers or classical computing components, a microwave signal generator and possibly other types of systems and subcomponents.

In some implementations, the control system 110 includes a computer system (e.g., the computer system 200 shown in FIG. 2 or another type of computer system) that generates control information for the quantum processor cell 102. For example, the control information can include parameter sets that define control signals for individual devices (e.g., qubit devices, coupler devices, readout devices, etc.) or for combinations of devices in the quantum circuit 104. Each parameter set can include digital information and can be generated by a classical computing system running a software program. For example, a parameter set may be generated, analyzed and modified by code running in Python or MATLAB® software (available from The MathWorks, Inc.) or another type of software program. In some instances, the classical computer analyzes a parameter set and updates all or part of the parameter set, for example, to improve the control signal based on a quality measure (e.g., fidelity or another figure of merit). For instance, the control system 110 may include a computer system configured to perform one or more of the operations represented in FIGS. 3A, 3B, 4A, 4B, 5A, 5B, 6A, 6B, and 7.

In some implementations, the control system 110 includes a waveform generator system that can synthesize analog signals from digital information. For example, the control system 110 may include an arbitrary waveform generator or another type of system having a digital-to-analog converter (DAC), which converts digital information to analog signals. In some instances, the digital information represents a parameter set for a control signal, and analog signal produced by the waveform generator system represents an instance of the control signal. The waveform generator system can output the analog signal for delivery to the quantum circuit 104. The analog signal can be, for example, a radio frequency or microwave frequency pulse produced on a physical transmission line.

In some implementations, the parameter set for a control signal includes voltage amplitudes for respective time segments of the control signal. For example, the control signal can be constructed as a sequence of time segments, with each time segment having an independent voltage amplitude, as show in FIGS. 4A, 4B, 5A, 5B, 6A, and 6B. In some examples, the voltage amplitude applied to the k-th qubit during the t-th time segment can be represented $\Omega_k(t)$. A parameter set for a control signal may include additional or different information. In some cases, the parameter set indicates a time duration, phase, amplitude or other parameter for each time segment of a control signal. The parameter set may be formatted, for instance, as one or more arrays of values representing these or other attributes of a control sequence for a quantum circuit.

In some implementations, the quantum computing system 100 utilizes high-fidelity quantum logic gates that are executed by the quantum processor cell 102 to perform quantum computational tasks. For example, the quantum computing system 100 may utilize a universal set of quantum logic gates, and may be configured to operate in a fault-tolerant regime in some instances. The quantum logic gates may be fast enough to allow many gate executions within a characteristic time scale (e.g., T1 time). In some cases, the control system 110 can produce control signals that perform fast, high-fidelity, universal single- and multi-qubit logic gates to be executed by the quantum processor cell 102. The control system 110 may analyze and update the parameter set for a control signal to improve a quality measure for a quantum logic operation. Examples of quality measures that may be used include simulated or measured quantum process fidelity, simulated or measured quantum state fidelity and others.

In some instances, a quality measure of a quantum logic operation (e.g., of a quantum logic gate or another type of quantum logic operation) to be applied to a quantum system can be the quantum state fidelity, which represents the overlap between the final state $\rho_{final}$ of the quantum system and the ideal expected state $\rho_{ideal}$ of the quantum system, $$F = Tr\left( \sqrt{ \sqrt{\rho_{ideal}}\, \rho_{final}\, \sqrt{\rho_{ideal}} } \right). \quad (1)$$

Here, $\rho_{ideal}$ represents the ideal expected state of the quantum system at the end of the quantum logic operation without any error, and $\rho_{final}$ represents the simulated or measured state of the quantum system at the end of the quantum logic operation accounting for loss channels. In some instances, a quality measure of a quantum logic operation can be the average state fidelity $$\overline{F} = \frac{F_\chi d + 1}{d + 1},$$

where $d=2^n$, with n being the number of qubits in the quantum system. Here, $$F_\chi = Tr(\chi_{ideal}\chi_{final}),$$

where $\chi_{ideal}$ is an ideal process matrix representing the quantum logic operation without any error, and $\chi_{final}$ is a simulated or measured process matrix representing the quantum logic operation with loss channels.

The density operator ρ representing the state of the quantum system obeys the Schrodinger equation and may be subject to qubit relaxation and dephasing processes:

$$\dot{\rho}=-i[H,\rho]+\gamma_j L[\sigma^j_\pm]\rho+\gamma_{\phi,j}L[\sigma^j_z]\rho \qquad (2)$$

where $\sigma_\pm$ are the raising and lowering operators for a qubit, $\gamma_j$ and $\gamma_{\phi,j}$ are relaxation and dephasing rates for a qubit. Here, $H=H_0+\Sigma_k\Omega_k(t)H_k$ can represent the total Hamiltonian of one or more qubits, with $H_0$ being the free Hamiltonian, while $H_k$ are control Hamiltonians describing qubit-control signal couplings or qubit-qubit interactions, and $\Omega_k(t)$ are control signal parameters. In this example, the system represented by the density operator ρ is coupled to loss channels (e.g., relaxation and dephasing processes), and Equation (2) includes a dissipation model that models the loss channels. In particular, the dissipation model is provided by the second and third terms in Equation (2), which include the damping superoperator L. Here, the damping superoperator L applied to an operator P may be given by $L[P]=P\rho P^+ - P^+P\rho/2 - \rho P^+P/2$.

Figure 2:
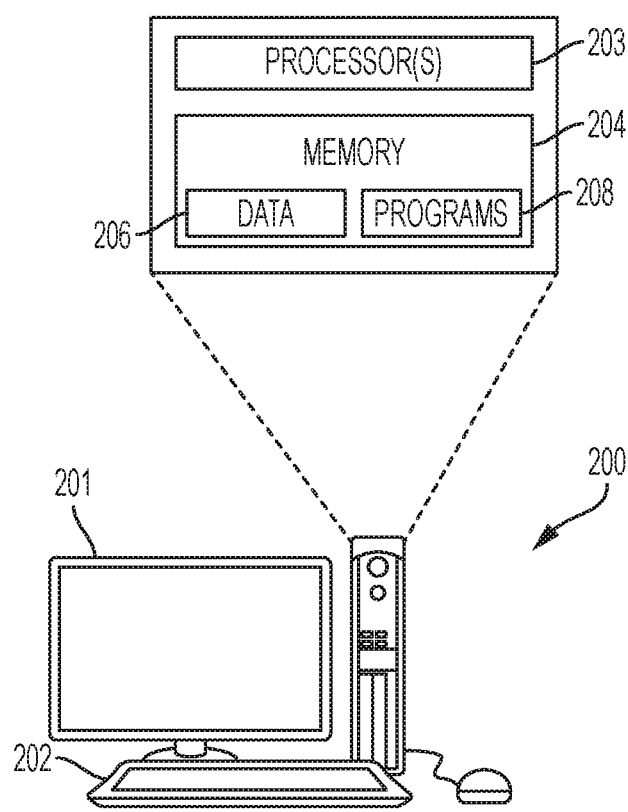
FIG. 2 is a block diagram of an example computer system.

FIG. 2 is a schematic diagram of an example computer system 200. The example computer system 200 includes a display device 201, an input device 202, processor(s) 203 and memory 204. The computer system 200 may include additional components, such as, for example, input/output controllers, communication links, etc. The computer system 200 can be used, for example, to analyze control signals for quantum circuits. For instance, the computer system 200 may be used to implement aspects of the example processes represented in FIGS. 3A, 3B, 4A, 4B, 5A, 5B, 6A, 6B and 7. The computer system 200 can be implemented as a classical computer that stores and processes information as classical bits.

The memory 204 can include, for example, a random access memory (RAM), a storage device (e.g., a writable read-only memory (ROM) or others), a hard disk, or another type of storage medium. The memory 204 can include various forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The computer system 200 can be preprogrammed or it can be programmed (and reprogrammed) by loading a program from another source (e.g., from a CD-ROM, from another computer device through a data network, or in another manner). The memory 204 can store instructions (e.g., computer code) associated with an operating system, computer applications, and other resources. The memory 204 can also store application data and data objects that can be interpreted by one or more applications or virtual machines running on the computer system 200. In the example shown in FIG. 2, the memory 204 stores data 206 and programs 208.

An input/output controller can be coupled to input devices and output devices (e.g., the display device 201, the input device 202, or other devices) and to a communication link. In the example shown, the display device 201 is a computer monitor, and the input device 202 is a keyboard. The computer system 200 may include other types of input devices, output devices, or both (e.g., mouse, touchpad, touchscreen, microphone, motion sensors, etc.). The input devices and output devices can receive and transmit data in analog or digital form over communication links such as a serial link, a wireless link (e.g., infrared, radio frequency, or others), a parallel link, or another type of link.

The computer system 200 may be connected to a communication link, which may include any type of communication channel, connector, data communication network, or other link. For example, the communication link can include a wireless or a wired network, a Local Area Network (LAN), a Wide Area Network (WAN), a private network, a public network (such as the Internet), a WiFi network, a network that includes a satellite link, or another type of data communication network.

The programs 208 can include software applications, scripts, programs, functions, executables, or other modules that are interpreted or executed by the processor(s) 203. Such applications may include machine-readable instructions for performing one or more of the operations represented in FIG. 3A, 3B, 4A, 4B, 5A, 5B, 6A, 6B, or 7. The programs 208 can obtain input data from the memory 204, from another local source, or from one or more remote sources (e.g., via a communication link). The programs 208 can generate output data and store the output data in the memory 204, in another local medium, or in one or more remote devices (e.g., by sending the output data via the communication link). The programs 208 (also known as software, software applications, scripts, or codes) can be written in any form of programming language, including compiled or interpreted languages, declarative or procedural languages. A computer program can be deployed to be executed on one computer or on multiple computers that are located at one site or distributed across multiple sites and interconnected by a communication network.

FIG. 3A is a flow diagram for an example process 300 for analyzing a control signal. In some instances, the process 300 can be used to optimize a control signal based on a quality measure for a quantum logic gate. All or part of the example process 300 can be performed by a computer system, for example, by executing one or more software programs on a classical computer system. For instance, the operations in the process 300 may be performed by the processor(s) 203 executing one or more of the programs 208 in FIG. 2.

As shown in FIG. 3A, the process 300 includes an outer loop 322 and an inner loop 302. The example process 300 shown in FIG. 3A may include additional or different loops or operations, and in some cases, one or more of the operations may be performed in another order. In some cases, one or more loops or operations are repeated or iterated, for example until a terminating condition is reached. In some cases, multiple operations can be combined or performed in parallel, or individual operations can be divided into multiple sub-operations.

At 302, initial parameters are obtained. The initial parameters include initial control signal amplitudes $\Omega_k^{(0)}(t_j^{(0)})$ for N time segments in a control signal for a superconducting quantum circuit, where $1 \leq j \leq N$. In some cases, the control signal time width $T_m$ is divided into N equal time segments of width $\Delta t$, such that $T_m = N\Delta t$. Other parameters obtained at 302 include a value $p_{limit}$, which represents an iteration limit for the inner loop 320; a value $F^{(l)}_{MIN}$, which represents a minimum gradient of the quality measure for the process 300 to remain in the inner loop 320; and a value $\epsilon$, where $1-\epsilon$ represents the sought quality measure (e.g., a minimum acceptable value for the quality measure).

Counters are also initialized at 302. In the example shown, a counter m=0 is initialized to count iterations of the outer loop 322, and a counter l=0 is initialized to count the number of times the control signal amplitudes are updated (at 312). In the outer loop 322, the counters m and l are increased when the conditions at both 306 and 314 are not met. The time width $T_m$ of the control signal may be modified (e.g., increased or decreased) on each iteration of the outer loop 322.

At 303, the time width $T_m$ of the control signal for the current iteration of the outer loop 322 is selected. In some implementations, the time width $T_m$ for the initial iteration can be chosen arbitrarily, and the process 300 may converge after one or more iterations of the inner loop 320, the outer loop 322 or both. A counter p=1 is also initialized at 303, to count iterations of the inner loop 320.

At 304, the quality measure $F^{(l)}$ for the current control signal amplitudes is computed. The quality measure $F^{(l)}$ may be computed, for example, using Equation (1). When Equation (1) is used to compute the quality measure, the density matrix $\rho_{ideal}$ can be computed by simulating the ideal quantum logic process, and the density matrix $\rho_{final}$ can be computed by simulating or executing the quantum logic process based on the current set of control signal amplitudes.

The quality measure can be computed based on measurements of the quantum process produced by delivering an instance of the control signal in the quantum circuit. For instance, the quality measure can be based on measurements obtained by quantum state tomography, by quantum process tomography, by randomized benchmarking or other types of measurements of the quantum circuit. Quantum state tomography can be used, for example, to reconstruct a quantum state (e.g., as a density matrix) of a quantum system by performing a series of measurements on over an ensemble. Quantum process tomography can be used to characterize a quantum process, for example, as a superoperator that can predict an output state for any input state. Randomized benchmarking can also be used to characterize a quantum process, for example, in terms of the average performance (e.g., average quality measure) per quantum logic operation. In an example randomized benchmarking protocol, a quantum system (e.g., a qubit) is initialized to its ground state, a large number of quantum logic operations (e.g., quantum logic gates) that form a group are applied and inverted, and the final state is then compared with the initial state to quantify the quality of the operations.

At 306, the quality measure computed at 304 is compared with the sought quality measure $1-\epsilon$. As shown in FIG. 3A, the process 300 is terminated when the quality measure computed at 304 is greater than or equal to the sought quality measure $1-\epsilon$. When the terminating condition is met, the quality measure $F^{(l)}$, the control signal $\Omega_k^{(l)}(T_m)$, and the time width $T_m$ are returned (e.g., provided as output) at 308. When the terminating condition is not met, the process 300 proceeds to 310. At 310, the gradient of the quality measure $\delta F^{(l)}/\delta \Omega_k^{(l)}(t_j^{(m)})$ is computed for a given control signal width $T_m$, quality measure $F^{(l)}$ and discrete control signal amplitudes $\Omega_k^{(l)}(t_j^{(m)})$.

At 312, one or more of the control signal amplitudes are updated. In some cases, the control signal amplitudes are updated by the process 350 shown in FIG. 3B or in another manner. In some iterations of the process 300, all control signal amplitudes may be updated at 312. In some iterations of the process 300, a single control signal amplitude may be updated at 312. In some iterations of the process 300, a subset (some but not all) of the control signal amplitudes may be updated at 312.

In some implementations, the control signal amplitudes are updated at 312 such that the new voltage amplitudes are computed according to $$\Omega_k^{(l)}(t_j^{(m)}) \to \Omega_k^{(l)}(t_j^{(m)}) + \delta F^{(l)}/\delta \Omega_k^{(l)}(t_j^{(m)}).$$

In this example, the new control signal amplitude for each time segment is the previous control signal amplitude for the time segment plus the gradient of the quality measure for the time segment. In some implementations, the second order derivative of the quality measure $$B^{(l)} = \partial^2 F^{(l)}/(\partial \Omega_k^{(l)})^2$$

is computed, and the direction of update of the control signal can be determined by computing $$p_k^{(l)} = -\frac{\partial F^{(l)}}{\partial \Omega_k^{(l)}} \frac{1}{B^{(l)}}.$$

A linear search can be performed to find an acceptable step size $\alpha_k^{(l)}$ in the direction $p_k^{(l)}$. The search for the step size can be performed, for example, by maximizing the quality measure $F^{(l)}$. The value of the step size that maximizes the fidelity may then be used to update the fidelity $F^{(l+1)}$ and to compute the new control amplitude $$\Omega_k^{(l+1)} \Omega_k^{(l)} + \alpha_k^{(l)} p_k^{(l)}.$$

The next iteration can be updated, for example, by introducing $$y_k^{(l+1)} = \frac{\partial F^{(l+1)}}{\partial \Omega_k^{(l+1)}} - \frac{\partial F^{(l)}}{\partial \Omega_k^{(l)}}$$

and $$B^{(l+1)} = y_k^{(l+1)}/\alpha_k^{(l)} p_k^{(l)}.$$

The update process can be iterated, for example, until the sought fidelity is achieved or until another terminating condition is reached. Other calculations or techniques can be used to compute the new voltage amplitudes at 312.

At 314, other criteria for improving the quality measure are evaluated. As shown in FIG. 3A, if the gradient of the quality measure is less than the minimum gradient of the quality measure $F'^{(l)}_{MIN}$, and if the value of the counter p is less than its limit value $p_{limit}$, then the process 300 proceeds to another iteration of the inner loop 320. At 316, the counters p and l are incremented by 1, and the process 300 returns to 304. If either condition is not met at 314, then the process 300 proceeds to another iteration of the outer loop 322. At 318, the counters m and l are incremented by 1, and the process 300 returns to 303.

FIG. 3B is a flow diagram for an example process 350 for updating a control signal. For example, the process 350 can be used to update the control signal amplitudes at 312 in the example process 300 shown in FIG. 3A. At 352, the gradient of the quality measure is obtained. At 354, the ratio of the current quality measure (based on the current control signal amplitudes) and the sought quality measure 1-ϵ is computed:

$$a = F^{(l)}/(1-\epsilon)$$

and the ratio of the gradient of the quality measure and the minimum gradient $F'^{(l)}_{MIN}$ is computed:

$$b = \frac{\delta F^{(l)}}{\delta \Omega_k^{(l)}(t_j^{(m)})} \bigg/ F'^{(l)}_{MIN}.$$

At 356, the ratios are evaluated. In some cases, if both ratios are between 0.9 and 1.0, then all of the control signal amplitudes are updated at 358. In some cases, if one or both ratios are less than 0.9, then a subset of the control signal amplitudes are selected and updated at 360. Accordingly, all of the control signal amplitudes or only a subset of the control signal amplitudes may be updated, based on the result of comparing the ratios to a critical value at 356. In the example shown in FIG. 3B, the critical value is 0.9, but another critical value can be used.

The control signal amplitudes may be updated at 358 or 360 according to the update equation $\Omega_k^{(l)}(t_j^{(m)}) \rightarrow \Omega_k^{(l)}(t_j^{(m)}) + \delta F^{(l)}/\delta \Omega_k^{(l)}(t_j^{(m)})$ described above, or the control signal amplitudes can be updated at 358 or 360 using another update equation. When the derivative of the quality measure is negative, the new amplitude of the j-th discrete signal can be decreased, for example:

$$\Omega_k^{(l+1)}(t_j^{(m)}) = \Omega_k^{(l)}(t_j^{(m)}) - \left| \frac{\delta F^{(l)}}{\delta \Omega_k^{(l)}(t_j^{(m)})} \right|,$$

Or when the derivative of the quality measure is positive, the new amplitude of the j-th discrete signal can be increased, for example:

$$\Omega_k^{(l+1)}(t_j^{(m)}) = \Omega_k^{(l)}(t_j^{(m)}) + \left| \frac{\delta F^{(l)}}{\delta \Omega_k^{(l)}(t_j^{(m)})} \right|.$$

FIG. 4A is a plot 400 of an example control signal before an update, and FIG. 4B is a plot 450 of the example control signal from FIG. 4A after an update. In FIGS. 4A and 4B, the control signal is represented as a sequence of voltage amplitudes for discrete time segments of the control signal. In the plots 400, 450, the vertical axis 410 represents a range of voltage amplitudes, and the horizontal axis 420 represents a time domain of the control signal. The control signal has total time duration T and is divided into N discrete time segments each having equal width Δt. The parameter set for the control signal specifies voltage amplitudes for the respective time segments, and the voltage amplitude for each time segment can be adjusted (increased or decreased) independent of the voltage amplitudes for the other time segments.

The initial voltage amplitudes $\Omega_k^{(l)}$ shown in FIG. 4A represent a version of the control signal that is analyzed on the l-th iteration of an iterative process (e.g., the process 300 shown in FIG. 3A or another type of process). In some cases, the initial voltage amplitudes $\Omega_k^{(l)}$ may be arbitrarily selected, computed by a prior iteration (e.g., by the (l-1)-th iteration), randomly selected, or specified in another manner.

The new voltage amplitudes $\Omega_k^{(l+1)}$ shown in FIG. 4B represent a version of the control signal that is analyzed on the (l+1)-th iteration of the iterative process. In some cases, the new voltage amplitudes $\Omega_k^{(l+1)}$ are computed in the prior iteration (e.g., by the l-1)-th iteration) of the iterative process and provided as input for the (l+1)-th iteration of the iterative process. In the example shown, the new voltage amplitudes $\Omega_k^{(l+1)}$ are generated by updating a first subset of the initial voltage amplitudes $\Omega_k^{(l)}$ and preserving a second subset of the initial voltage amplitudes $\Omega_k^{(l)}$. In particular, four of the initial voltage amplitudes (labeled 430A, 432A, 434A, 436A) in FIG. 4A are modified to generate the four corresponding new voltage amplitudes (labeled 430B, 432B, 434B, 436B) in FIG. 4B; all of the initial voltage amplitudes other than 430A, 432A, 434A, 436A in FIG. 4A are preserved, such that all of the voltage amplitudes other than 430B, 432B, 434B, 436B in FIG. 4B are equal to the corresponding initial voltage amplitudes in FIG. 4A. The first subset (i.e., the initial voltage amplitudes to be updated) can be selected randomly, systematically (e.g., based on the control signal or other information), sequentially (e.g., based on the iteration, with a specified time spacing, etc.) or otherwise.

The values form the new voltage amplitudes 430B, 432B, 434B, 436B may be randomly selected, computed based on the values of the initial voltage amplitudes 430A, 432A, 434A, 436A or computed in another manner. For instance, each of the new voltage amplitudes 430B, 432B, 434B, 436B may be computed based on the gradient of a quality measure with respect to the voltage amplitude or other calculations. As shown, the initial voltage amplitudes 430A and 432A are increased to define the new voltage amplitudes 430B and 432B, respectively; and the initial voltage amplitudes 434A and 436A are decreased to define the new voltage amplitudes 434B and 436B, respectively.

FIG. 5A is a plot 500 of another example control signal before an update, and FIG. 5B is a plot 550 of the example control signal from FIG. 5A after an update. The example control signal shown in FIGS. 5A and 5B is similar to the example shown in FIGS. 4A and 4B, for instance, the control signal has total time duration T and is divided into N discrete time segments each having equal width Δt. In the plots 500, 550, the vertical axis 508 represents a range of voltage amplitudes, and the horizontal axis 506 represents a time domain of the control signal. In the example shown in FIGS. 5A and 5B, all of the initial voltage amplitudes $\Omega_k^{(l)}$ are evaluated and modified to generate the new voltage amplitudes $\Omega_k^{(l+1)}$. As shown by the arrows in FIG. 5A, some of the initial voltage amplitudes $\Omega_k^{(l)}$ are increased while others are decreased to generate the new voltage amplitudes $\Omega_k^{(l+1)}$ shown in FIG. 5B. The values of the new voltage amplitudes in FIG. 5B may be randomly selected, computed based on the values of the initial voltage amplitudes shown in FIG. 5A or computed in another manner.

FIG. 6A is a plot 600 of another example control signal before an update, and FIG. 6B is a plot 650 of the example control signal from FIG. 6A after an update. The example control signal shown in FIGS. 6A and 6B is similar to the example shown in FIGS. 4A and 4B, for instance, the control signal has total time duration T and is divided into N discrete time segments each having equal width Δt. In the plots 600, 550, the vertical axis 606 represents a range of voltage amplitudes, and the horizontal axis 604 represents a time domain of the control signal. In the example shown in FIGS. 6A and 6B, only one of the initial voltage amplitudes (labeled 602A) in FIG. 6A is modified to generate the corresponding new voltage amplitude (labeled 602B) in FIG. 6B; all of the initial voltage amplitudes other than 602A in FIG. 6A are preserved, such that all of the voltage amplitudes other than 602B in FIG. 6B are equal to the corresponding initial voltage amplitudes in FIG. 6A. The voltage amplitude 602A (i.e., the initial voltage amplitudes to be updated) can be selected randomly, systematically (e.g., based on the control signal or other information), sequentially (e.g., based on the iteration, at a specified time position, etc.) or otherwise.

Figure 7:
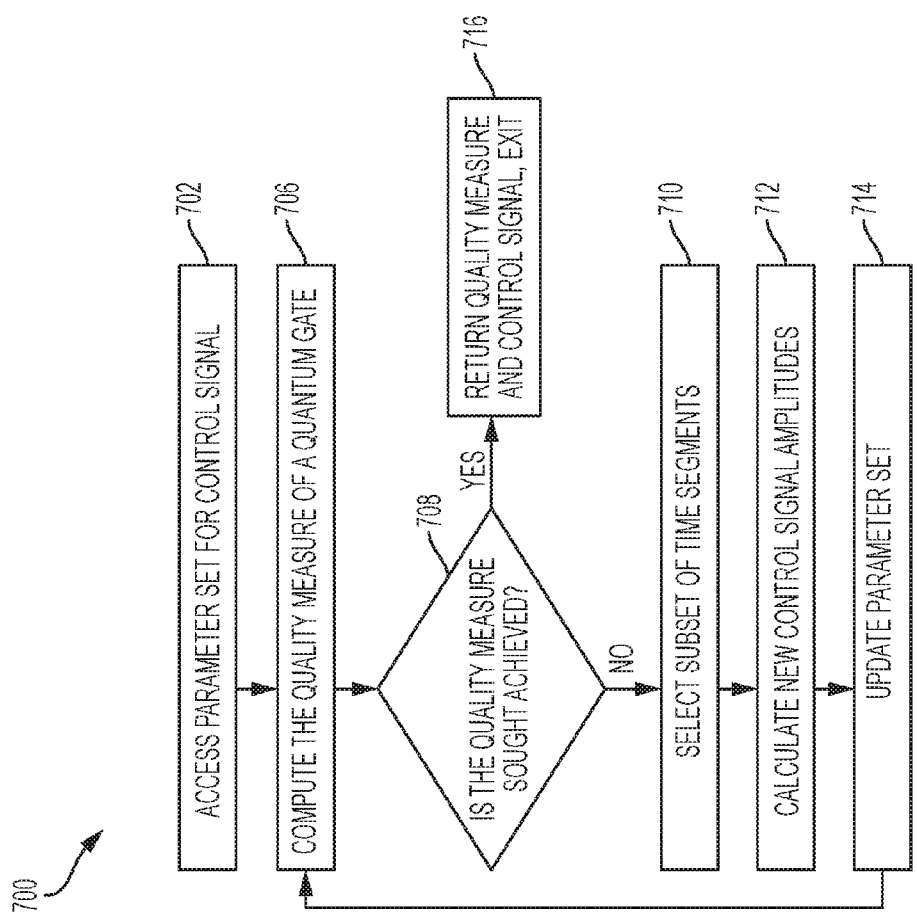
FIG. 7 is flow diagram for an example process for analyzing a control signal.

FIG. 7 is flow diagram for an example process 700 for analyzing a control signal. In some instances, the process 700 can be used to optimize a control signal based on a quality measure for a quantum logic gate. All or part of the example process 700 can be performed by a computer system, for example, by executing one or more applications on a classical computer system. For instance, the operations in the process 700 may be performed by the processor(s) 203 executing one or more of the programs 208 in FIG. 2.

The example process 700 shown in FIG. 7 may include additional or different operations, and in some cases, one or more of the operations may be performed in another order. In some cases, one or more the operations are repeated or iterated, for example until a terminating condition is reached. In some cases, multiple operations can be combined or performed in parallel, or individual operations can be divided into multiple sub-operations.

At 702, a parameter set for a control signal is accessed. The parameter set includes digital information that specifies a control signal for a superconducting quantum circuit. For example, the control signal can be configured to control the example quantum circuit 104 shown in FIG. 1 or another type of quantum circuit. The digital information in the parameter set accessed at 702 includes initial voltage amplitudes for respective time segments in the control signal. As an example, the parameter set may include the initial voltage amplitudes $\Omega_k^{(I)}$ shown in FIG. 4A, 5A or 6A.

At 706, a quality measure of a quantum logic gate is computed based on the parameter set for the control signal. The quality measure indicates the quality of a quantum logic operation produced by delivery of the control signal in the superconducting quantum circuit. For example, the superconducting quantum circuit may include a superconducting qubit device (e.g., a qubit device that includes a Josephson junction), and the quality measure can be based on a quantum logic gate for the qubit device. In some cases, the quantum logic operation can be a single quantum logic gate, a quantum logic circuit that includes multiple quantum logic gates or another type of quantum logic operation.

In some instances, the quality measure is computed at 706 based on a simulation of the quantum logic process produced by the control signal. The simulated quantum logic process may include a dissipation model. The dissipation model can model energy relaxation, the dephasing of quantum superposition states due to interaction with the environment or other phenomena. For example, the dissipation model can be based on Equation (2) above, or another type of dissipation model can be used. In some instances, the quality measure is computed based on an execution the quantum logic process by delivering the control signal to the superconducting quantum circuit. The executed quantum logic process may be measured, for example, using quantum process tomography, quantum state tomography or a combination of these and other procedures.

The quality measure can be a simulated or measured fidelity or another measure of quality. For example, the quality measure can be a quantum process fidelity representing a comparison between an ideal quantum logic process and a simulated or measured quantum logic process. A simulated quantum logic process may be executed by a classical computer based on the parameter set; a measured quantum logic process may be executed by the superconducting quantum circuit based on the parameter set. As another example, the quality measure can be a quantum state fidelity representing a comparison between an ideal quantum state and a simulated or measured quantum state. A simulated quantum state may be provided by a classical simulation based on the parameter set; a measured quantum state may be produced by the superconducting quantum circuit based on the parameter set. The ideal quantum logic process may represent a quantum logic operation produced by the ideal quantum process in the absence of loss channels. Another type of quality measure may be used.

At 708, the quality measure computed at 706 is compared with a sought value of the quality measure. If it is determined at 708 that the quality measure sought is achieved, then the process 700 proceeds to 716; otherwise the process 700 proceeds to 710. At 716, the quality measure and the control signal are returned. For instance, the quality measure computed at 706 and the parameter set accessed at 702 (and possibly updated at 714) can be provided as output. The output may be stored in memory, displayed, provided as input to another process or handled in another manner.

At 710, a subset of the time segments are selected. The subset of time segments selected at 710 includes multiple time segments, but less than all of the time segments in the control sequence. The subset of the time segments are selected for improving the quality measure of the quantum logic operation produced by delivery of the control signal in the superconducting quantum circuit. For example, the subset may be selected to improve the fidelity of a control signal to perform a quantum logic gate. FIGS. 4A and 4B show an example where a subset of multiple time segments is selected for improving a quality measure. The example subset shown in FIGS. 4A and 4B includes four time segments, but another number of time segments may be selected.

In some implementations, the subset of time segments are selected randomly at 710. The number of time segments in the subset may be randomly selected on each iteration. For example, a random integer in a specified range (e.g., a random integer between one and the number of time segments in the control signal) may be obtained based on an output from a pseudorandom generator, and the size of the subset can be set equal to, or otherwise computed based on, the random integer. The identities of time segments in the subset may be randomly selected on each iteration. For example, the time segments can be identified by their respective positions in the control signal; random integers (e.g., a number of integers equal to the number of time segments to be included in the subset) in a specified range (e.g., each between one and the number of time segments in the control signal) may be obtained based on an output from a pseudorandom generator, and the time segments at the time positions of the random integers can be selected as the subset.

At 712, new control signal amplitudes are computed for the selected subset of the time segments. The new voltage amplitudes are calculated to improve the quality measure. In some cases, new voltage amplitudes are calculated for all of the time segments in the subset. The new voltage amplitudes may be computed by an iterative process (e.g., the iterative process 300 shown in FIG. 3A or another type of iterative process), by an optimization process, or by another type of process. An optimization process can include an iterative process that minimizes the difference between the sought quality measure and the simulated or measured quality measure.

At 714, the parameter set is updated. In particular, the parameter set is updated to include the new control signal amplitudes computed at 712. As an example, the updated parameter set may include the new voltage amplitudes $\Omega_k^{(l+1)}$ shown in FIG. 4B. In the example process 700, the parameter set is updated to include the new voltage amplitudes for the selected subset of segments while preserving the initial voltage amplitudes for a second subset of the time segments (e.g., for all other time segments).

After the parameter set is updated at 714, the process 700 returns to 706 for another iteration. The process 700 may continue iterating, for instance, until the quality measure sought is achieved at 708 or until another terminating condition is met (e.g., until a maximum number of iterations is reached, until a maximum runtime is reached, etc.)

In some cases, after the process 700 produces a parameter set (e.g., the parameter set returned at 716), an instance of the control signal represented by the parameter set is generated for delivery to the superconducting quantum circuit. For example, the instance of the control signal may be generated by a digital to analog converter receiving and processing the updated parameter set. In some cases, the process 700 produces a first parameter set (e.g., the parameter set returned at 716), and another, subsequently-executed process generates a second updated parameter set from the first updated parameter set based on evaluating the voltage amplitudes for all time segments to improve the quality measure. For instance, the parameter set produced by the process 700 may be further refined or updated as the example shown in FIGS. 5A and 5B.

Figure 8:
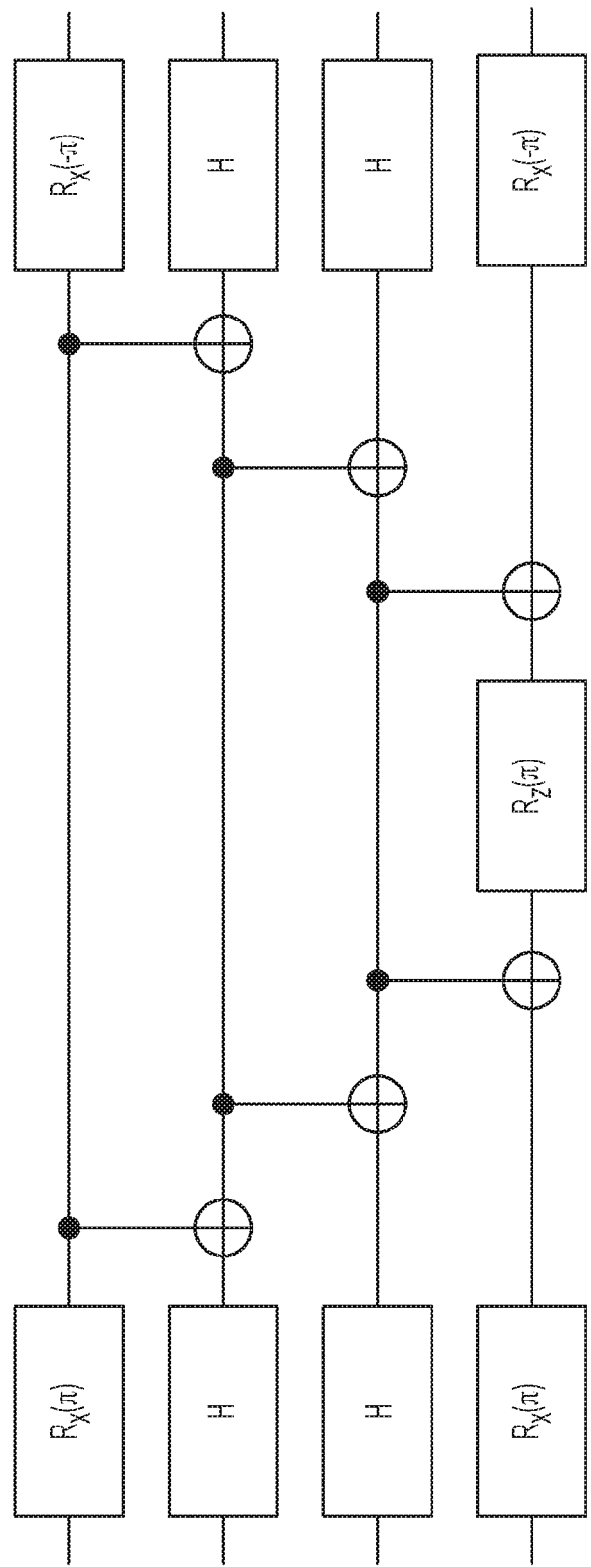
FIG. 8 a diagram of an example quantum logic circuit.

FIG. 8 is a diagram of an example quantum logic circuit 800. The quantum logic circuit 800 includes quantum logic gates that can be implemented using control signals generated, analyzed or updated according to the processes represented in FIG. 3A, 3B, 4A, 4B, 5A, 5B, 6A, 6B or 7. In some implementations, the example quantum logic circuit shown in FIG. 8 is a subset of a quantum circuit for solving the eigenvalues of a hydrogen molecule using single and two qubit logic gates. In the example shown, the single-quit logic gates are Hadamard gates and rotations about the x-axis or z-axis, and the two-qubit logic gates are controlled-not gates. In some implementations, one can optimize over random circuits for randomized benchmarking.

In a general aspect of the subject matter described above, control of a quantum circuit is analyzed.

In a first example, one or more parameters of a control signal of a superconducting quantum circuit are accessed. A parameter set that includes initial voltage amplitudes for respective time segments of the control signal are accessed. A first subset of time segments is selected to construct the control signal that improves the quality measure of a quantum logic operation. The new voltage amplitudes for a first time segment in the first subset are calculated to improve the quality measure of a quantum logic operation. The parameter set is updated to include the new voltage amplitude for the first subset while preserving the initial voltage amplitudes for the second subset of the time segments.

In a second example, a system includes a superconducting quantum circuit and a control system. The control system includes one or more processors configured to perform some or all of the operations of the first example.

Implementations of first or second example may include one or more of the following features. New voltage amplitudes for the time segments in the first subset are calculated; the new voltage amplitudes are calculated to improve the quality measure. The parameter set is updated to include the new voltage amplitudes for the first subset of time segments while preserving the initial voltage amplitudes for the second subset of the time segments. Updating the parameter set produces a first updated parameter set, and a second updated parameter set is produced from the first updated parameter set based on evaluating the voltage amplitudes for all time segments to improve the quality measure.

Implementations of first or second example may include one or more of the following features. An iterative process includes, on each iteration: selecting time segments for improving a quality measure of the quantum logic operation; calculating a new voltage amplitude for one or more of the selected time segments, each new voltage amplitude calculated to improve the quality measure; and updating the parameter set to include the new voltage amplitudes. The iterative process can be implemented as an optimization process configured to optimize the quality measure.

Implementations of first or second example may include one or more of the following features. The quality measure is a quantum process fidelity that represents a comparison between an ideal execution of the quantum logic operation and a simulated execution of the quantum logic operation based on the parameter set. The quality measure is a quantum state fidelity that represents a comparison between an ideal state produced by an ideal execution of the quantum logic operation and a simulated state produced by a simulated execution of the quantum logic operation based on the parameter set. The simulated execution of the quantum logic operation comprises a dissipation model.

Implementations of first or second example may include one or more of the following features. The superconducting quantum circuit is part of a quantum processor, and the quantum logic operation includes multiple quantum logic gates to be executed by the quantum processor. The superconducting quantum circuit includes a qubit device that includes a Josephson junction, and the quantum logic operation comprises a quantum logic gate for the qubit device. An instance of the control signal is generated for delivery to the superconducting quantum circuit. The instance of the control signal is generated by a digital to analog converter processing the updated parameter set.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method comprising:
   accessing a parameter set for a control signal for a superconducting quantum circuit, the parameter set comprising initial voltage amplitudes for respective time segments of the control signal;
   selecting a first subset of the time segments for improving a quality measure of a quantum logic operation produced by delivery of the control signal in the superconducting quantum circuit;
   by operation of data processing apparatus, calculating a new voltage amplitude for a first time segment in the first subset, the new voltage amplitude calculated to improve the quality measure; and
   updating the parameter set to include the new voltage amplitude for the first time segment while preserving the initial voltage amplitudes for a second subset of the time segments.

2. The method of claim 1, comprising:
   by operation of data processing apparatus, calculating new voltage amplitudes for the time segments in the first subset, the new voltage amplitudes calculated to improve the quality measure; and
   updating the parameter set to include the new voltage amplitudes for the first subset of time segments while preserving the initial voltage amplitudes for the second subset of time segments.

3. The method of claim 2, wherein updating the parameter set produces a first updated parameter set, and the method further comprises producing a second updated parameter set from the first updated parameter set based on evaluating the voltage amplitudes for all time segments to improve the quality measure.

4. The method of claim 2, comprising performing an iterative process that includes, on each iteration:
   selecting time segments for improving a quality measure of the quantum logic operation;
   calculating a new voltage amplitude for one or more of the selected time segments, each new voltage amplitude calculated to improve the quality measure; and
   updating the parameter set to include the new voltage amplitudes.

5. The method of claim 4, wherein the iterative process comprises an optimization process configured to optimize the quality measure.

6. The method of claim 1, wherein the quality measure comprises a quantum process fidelity that represents a comparison between an ideal execution of the quantum logic operation and a simulated execution of the quantum logic operation based on the parameter set.

7. The method of claim 6, wherein the simulated execution of the quantum logic operation comprises a dissipation model.

8. The method of claim 1, wherein the quality measure comprises a quantum state fidelity that represents a comparison between an ideal state produced by an ideal execution of the quantum logic operation and a simulated state produce by a simulated execution of the quantum logic operation based on the parameter set.

9. The method of claim 1, wherein a quantum processor comprises the superconducting quantum circuit, and the quantum logic operation comprises multiple quantum logic gates to be executed by the quantum processor.

10. The method of claim 1, wherein the superconducting quantum circuit includes a qubit device comprising a Josephson junction, and the quantum logic operation comprises a quantum logic gate for the qubit device.

11. The method of claim 1, further comprising generating an instance of the control signal for delivery to the superconducting quantum circuit.

12. The method of claim 11, wherein the instance of the control signal is generated by a digital to analog converter processing the updated parameter set.

13. A system comprising:
   a superconducting quantum circuit; and
   a control system comprising one or more processors configured to:
     access a parameter set for a control signal for the superconducting quantum circuit, the parameter set comprising initial voltage amplitudes for respective time segments of the control signal;
     select a first subset of the time segments to evaluate for improving a quality measure of a quantum logic operation produced by delivery of the control signal in the superconducting quantum circuit;
     calculate a new voltage amplitude for a first time segment in the first subset, the new voltage amplitude calculated to improve the quality measure; and
     update the parameter set to include the new voltage amplitude for the first time segment while preserving the initial voltage amplitudes for a second subset of the time segments.

14. The system of claim 13, wherein the one or more processors are configured to:
   calculate new voltage amplitudes for the time segments in the first subset, the new voltage amplitudes calculated to improve the quality measure;
   update the parameter set to include the new voltage amplitudes for the first subset of time segment while preserving the initial voltage amplitudes for the second subset of time segments.

15. The system of claim 13, wherein the one or more processors are configured to perform an iterative process that includes, on each iteration:
   selecting time segments for improving a quality measure of the quantum logic operation; and
   calculating a new voltage amplitude for one or more of the selected time segments, each new voltage amplitude calculated to improve the quality measure; and
   updating the parameter set to include the new voltage amplitudes.

16. The system of claim 15, wherein the iterative process comprises an optimization process configured to optimize the quality measure.

17. The system of claim 13, wherein the quality measure comprises a quantum process fidelity that represents a comparison between an ideal execution of the quantum logic operation and a simulated execution of the quantum logic operation based on the parameter set.

18. The system of claim 17, wherein the simulated execution of the quantum logic process comprises a dissipation model.

19. The system of claim 13, wherein the quantum logic operation comprises multiple quantum logic gates.

20. The system of claim 13, wherein the superconducting quantum circuit includes a qubit device comprising a Josephson junction, and the quality measure is based on a quantum logic gate for the qubit device.

21. The system of claim 20, wherein the control system is operable to generate an instance of the control signal for delivery to the qubit device.

22. The system of claim 13, wherein the control system comprises a digital to analog converter configured to generate an instance of the control signal by processing the updated parameter set.

* * * * *

UNITED STATES PATENT AND TRADEMARK OFFICE
CERTIFICATE OF CORRECTION

PATENT NO. : 9,979,400 B1
APPLICATION NO. : 15/335846
DATED : May 22, 2018
INVENTOR(S) : Sete et al.

Page 1 of 1

It is certified that error appears in the above-identified patent and that said Letters Patent is hereby corrected as shown below:

On the Title Page

Column 1, (*) Notice, Line 3, delete "days. days." and insert -- days. -- therefor.

Column 1, (22) Filed, Line 1, after "2016", insert -- ¶(65) Prior Publication Data US 2018/0123597 A1 May 3, 2018 -- therefor.

Page 2, Column 1, Other Publications, Line 26, delete "Mar. 28, 2018." and insert -- Mar. 26, 2018, -- therefor.

In the Specification

Column 6, Detailed Description, Line 56, delete "302." and insert -- 320. -- therefor.

Signed and Sealed this
Sixteenth Day of April, 2019

Andrei Iancu
*Director of the United States Patent and Trademark Office*